United States Patent [19]

Sato

[11] Patent Number: 5,477,140
[45] Date of Patent: Dec. 19, 1995

[54] TERMINAL INSPECTION DEVICE AND TERMINAL INSPECTION METHOD

[75] Inventor: Takayuki Sato, Shizuoka, Japan

[73] Assignee: Yazaki Corporation, Tokyo, Japan

[21] Appl. No.: 298,437

[22] Filed: Aug. 30, 1994

[30] Foreign Application Priority Data

Aug. 30, 1993 [JP] Japan .................. 5-046973 U

[51] Int. Cl.$^6$ .................................................. G01R 31/08
[52] U.S. Cl. ........................................ 324/158.1; 324/72.5
[58] Field of Search ................................ 324/754, 755, 324/537, 500, 523, 540, 158.1, 489, 482, 483, 421, 725; 439/69, 70, 71

[56] References Cited

U.S. PATENT DOCUMENTS

| 3,701,077 | 10/1972 | Kelly, Jr. .................. | 324/754 |
| 3,743,925 | 7/1973 | Bossi ......................... | 324/754 |
| 4,658,212 | 4/1987 | Ozawa et al. ............. | 324/158 F |
| 5,247,259 | 9/1993 | Miller et al. .............. | 324/540 |
| 5,321,363 | 6/1994 | Wakamatsu et al. ...... | 324/523 |

Primary Examiner—Vinh P. Nguyen
Attorney, Agent, or Firm—Sughrue, Mion, Zinn, Macpeak & Seas

[57] ABSTRACT

A body block is fixed to a conductive frame, and the frame has a terminal inserting hole and a contact block accommodating hole which open into each other. A conductive contact is movably supported within the accommodating hole and biased toward the terminal inserting hole by a conductive elastic member. A cover is provided for insertion into the terminal inserting hole to hold the terminal in place, and a driving device is provided for moving the cover in and out of the terminal inserting hole. An electric wire is connected between a measuring device and the frame. A terminal is inserted into the terminal inserting hole in contact with the conductive contact block, and the cover is moved into the terminal inserting hold to fix the position of the terminal. A connection wire or lead from the terminal is connected to the measuring device, so that a circuit is formed by the terminal, the conductive block, the elastic member, the frame, the electric wire, the measuring device, the lead, and the terminal. The connection between the lead and the terminal can be checked based on the output of the measuring device, and the elastic member ensures that the terminal and the contact block are securely contacted simply by inserting the terminal into the terminal inserting hole against the force of the elastic member and inserting the cover to fix the position of the terminal.

14 Claims, 3 Drawing Sheets

TERMINAL INSPECTION DEVICE AND TERMINAL INSPECTION METHOD

FIELD OF THE INVENTION

This invention relates to a terminal inspection device for inspecting the conduction of a single-pole terminal having an electric wire connected thereto and an inspection method thereof.

BACKGROUND OF THE INVENTION

Terminal inspection devices include a device for checking a proper fitting of a male terminal and a female terminal, and a device for checking a certain connection of a terminal and a connected electric wire.

The former inspection device measures a force necessary to fit or remove the male terminal into or from the female terminal to find a defective product which has an insufficient connecting force for fitting. In the latter inspection device, an inferior connection of the terminal and the connected electric wire is found by fitting the terminal having the electric wire connected thereto with a member having an electric wire and connecting each electric wire with a measuring means to determine a current value flowing in a circuit.

FIG. 4 is an explanatory view showing a conventional inspection device for inspecting a connection state of a female terminal and a connected electric wire. To the surface of a frame 1 prepared by bending a plate, a body block 3 having a terminal inserting hole 2 is attached. To the back face of the frame 1, a tab pin 4 made of a conductive material and an electric wire 5 in contact with the tab pin 4 are fastened by means of a bolt 6, and an end of the electric wire 5 is connected to a measuring means (A). A leading end of the tab pin 4 projects into the terminal inserting hole 2 passing through the frame 1.

FIG. 3 is a perspective view of a female terminal to be inspected. At the leading end of a female terminal 7, an electric connection part 8 which elastically engages a male terminal is disposed, and an electric wire connection part 9 is disposed at the rear end. The electric wire connection part 9 consists of a holding part 9a for holding an insulating coating of a connected electric wire W by press-contacting, and a holding part 9b for holding a conductor of the connected electric wire W by press-contacting.

A connection state of the female terminal 7 and the connected electric wire W is inspected by the following procedure. When the leading end of the female terminal 7 is inserted into the terminal inserting hole 2, the tab pin 4 is fitted into the electric connection part 8 to be held by an elastic force of the electric connection part 8. The end of the connected electric wire W is connected to a measuring means (A) and a current is passed. The connection state of the connected electric wire W and the holding part 9b can be determined from a measured value obtained by the measuring means (A). After the inspection, the female terminal 7 is pulled out, and another female terminal 7 is fitted with the tab pin 4 and inspected. This procedure is repeated to inspect tile terminals.

The female terminal 7 is moved vertically and horizontally to be pulled out from the terminal inserting hole 2 as the female terminal is fitted with the tab pin. Therefore, there are disadvantages that the electric connection part 8 is enlarged or deformed.

In addition, the fitting or removing of the female terminal 7 to or from the tab pin 4 is troublesome and the fitting may be unstable depending on workmanship of the tab pin 4. Thus, successive inspection of many terminals cannot be made smoothly.

SUMMARY OF THE INVENTION

An object of the present invention is to provide a terminal inspection device and a terminal inspection method for inspecting the connection state of a single-pole terminal and a connected electric wire by which tile terminal can be easily inserted into and removed from the inspection device, the terminal can be securely inserted, and the terminal is not subjected to an undesirable load when removed from the inspection device.

The terminal inspection device of the invention comprises a frame made of a conductive material to which a body block is fixed, which has a terminal inserting hole open to its surface and a contact block accommodating hole in contact with the terminal inserting hole. A conductive contact block is elastically attached on the frame by means of a conductive elastic member within the contact block accommodating hole. A terminal holding means which is movable in a direction to open or close the terminal inserting hole and a drive member which operates the terminal holding means are disposed on the frame. Further, an electric wire is connected between a measuring means and the frame.

The terminal inspection method of the invention comprises contacting a terminal, which is inserted into the terminal inserting hole, to the conductive contact block elastically attached to the frame by the conductive elastic member, securely keeping the contact of the terminal with the contact block by the terminal holding means and inspecting the connection state of the terminal and the connected electric wire.

DETAILED DESCRIPTION OF THE INVENTION

Figure 1:
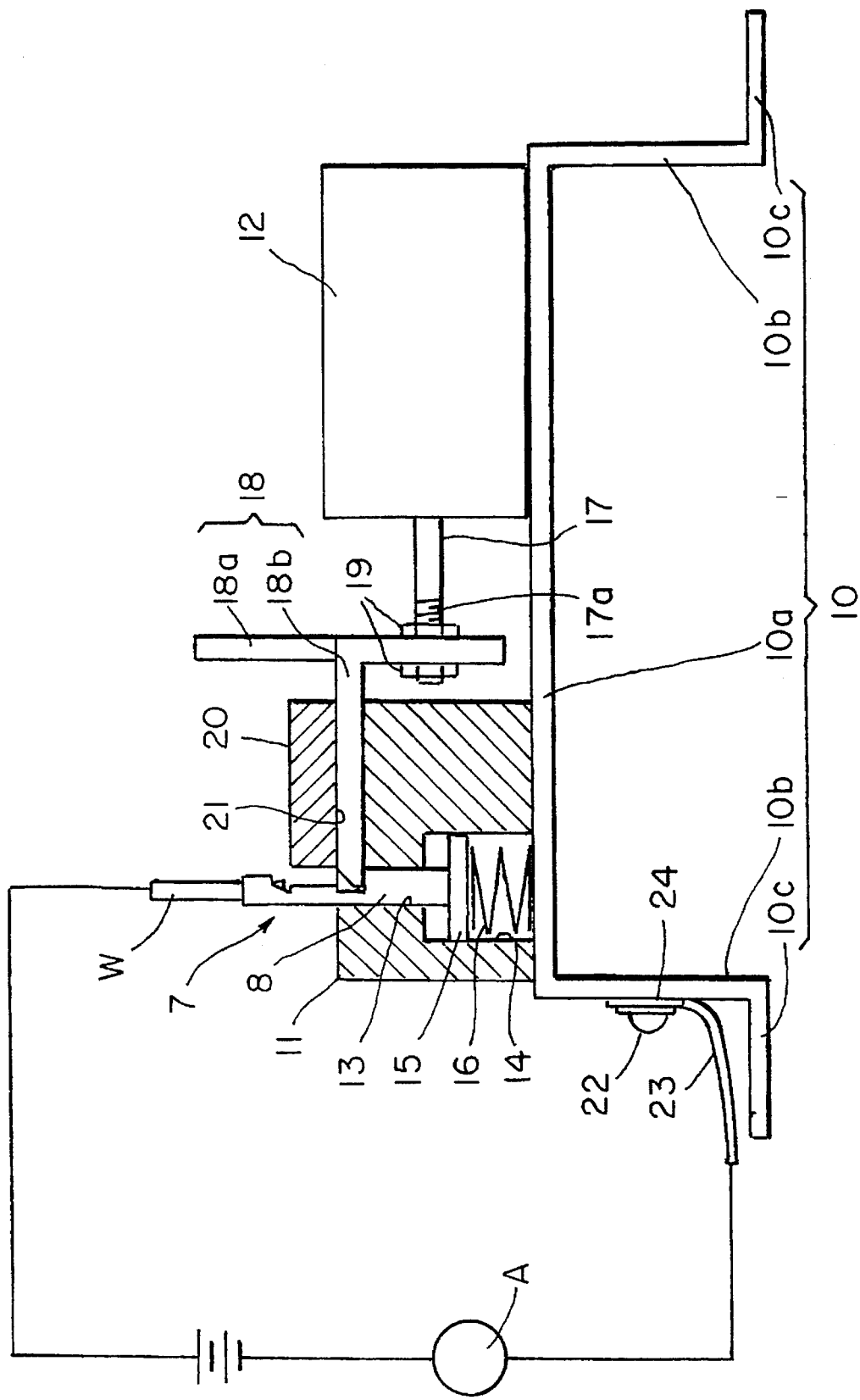
FIG. 1 is a partially sectional front view of a terminal inspecting device of the present invention in an inspecting state.

A terminal inspection device of the invention comprises a frame made of a conductive material to which a body block is fixed, which has a terminal inserting hole open to its surface and a contact block accommodating hole in contact with the terminal inserting hole. The contact block accommodating hole is preferably formed to have a larger diameter than the terminal inserting hole. Within the contact block accommodating hole, a conductive contact block is elastically attached to the frame by means of a conductive elastic member. A terminal holding means which is movable in a direction to open or close the terminal inserting hole and a drive member which operates the terminal holding means are disposed on the frame. Further, an electric wire is connected between a measuring means and the frame.

A terminal inspecting method of the invention comprises fixing a body block to a frame made of a conductive material, forming a terminal inserting hole open to the surface of the body block and a contact block accommodating hole in contact with the terminal inserting hole within the body block, disposing a conductive contact block elastically attached to the frame by a conductive elastic member within the contact block accommodating hole, and providing a terminal holding means which is movable in a direction to open or close the terminal inserting hole and a drive member which drives the terminal holding means in a movable direction on the frame. A terminal, which is inserted into the terminal inserting hole, is contacted with the conductive contact block elastically attached to the frame by the conductive elastic member, then, the terminal holding means is moved to close the terminal inserting hole. After connecting the connected electric wire of the terminal to the measuring means, a current is passed and the conduction of the terminal and the connected electric wire is judged from a measured value obtained with the measuring means. After completing the inspection, the terminal holding means is moved to open the terminal inserting hole so as to remove the terminal. Similarly, another terminal is inspected.

According to the present invention, since the elastic member presses the contact block toward the terminal inserting hole side, the terminal can be securely contacted to the contact block by simply inserting the terminal into the terminal inserting hole. As the contact block accommodating hole has a wider horizontal sectional area than the terminal inserting hole, the contact block can be made bigger than the tip area of the terminal resulting in steady contact of the terminal with the contact block. Further, the terminal inserting hole is closed by the terminal holding means, therefore, the terminal is prevented from being removed from the terminal inserting hole during inspection. The terminal is held in a state pressing the contact block by the terminal holding means, so that measurement is surely conducted. After completing the inspection, the terminal holding means is opened and the terminal which is released from the restriction by the terminal holding means is pushed upward by the contact block, so that the terminal can be removed easily, thereby, the inspections can be readily performed one after another.

EXAMPLE

Figure 2:
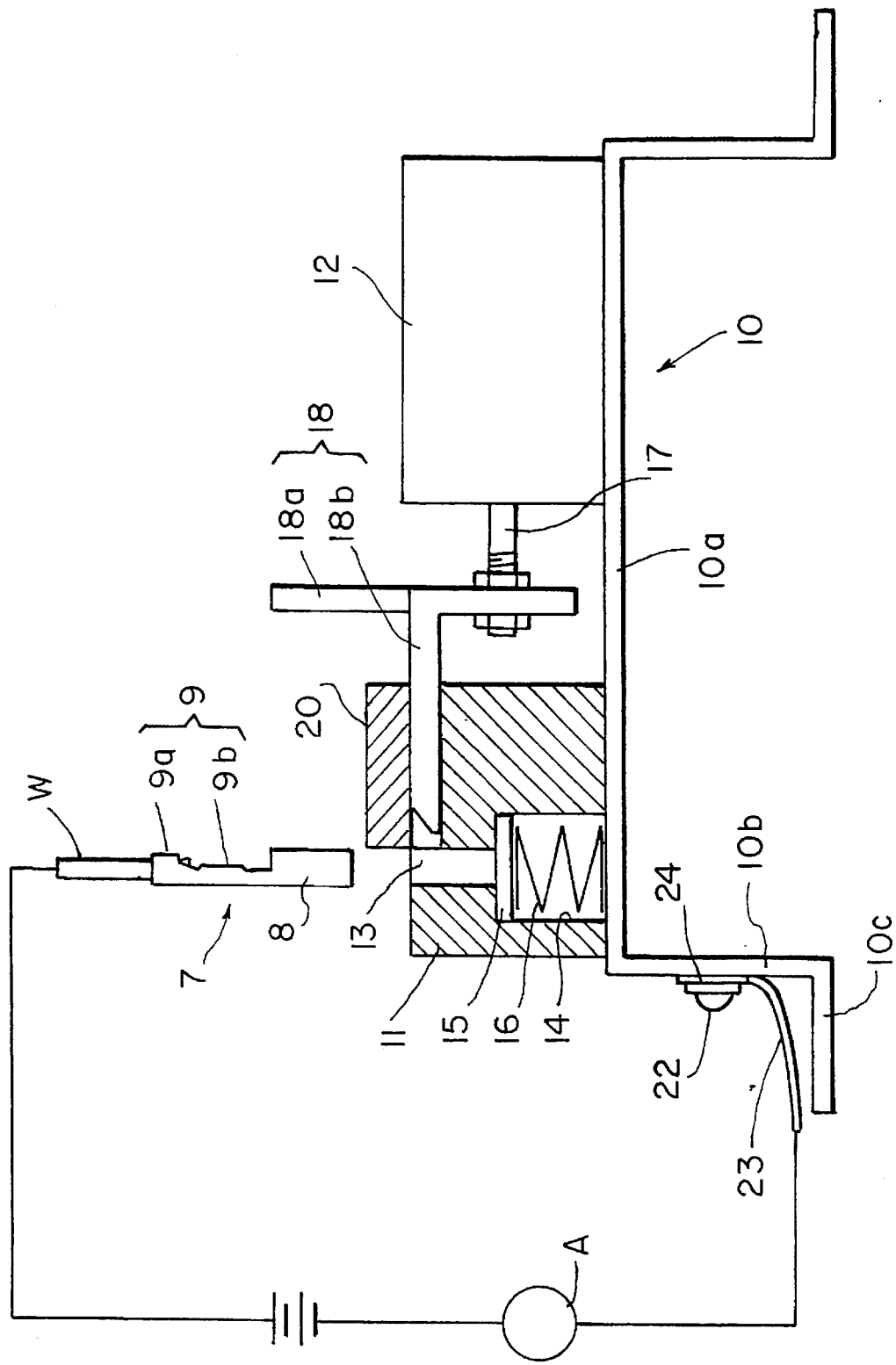
FIG. 2 is a partially sectional front view of a terminal inspecting device of the present invention with a terminal removed (or before the terminal insertion).

FIG. 1 is a partially sectional front view of the terminal inspecting device of the invention showing an inspecting state, and FIG. 2 is a partially sectional front view of the terminal inspecting device of the invention with a terminal removed (or before the terminal insertion).

A frame 10 which is a base of the terminal inspecting device is formed by bending a conductive plate to have a leg 10b on either side of a center section 10a and a fixing part 10c at the end of each leg 10b, and a fixing hole (not shown) is formed in each fixing part 10c.

A body block 11 and a drive member 12 are screwed to on the center section 10a of the frame 10.

The body block 11 has a terminal inserting hole 13 which is open to the surface (top face in FIG. 1 and FIG. 2) and a contact block accommodating hole 14 which contacts the terminal inserting hole 13 and is open to the back face and formed coaxially with the hole. The contact block accommodating hole 14 is formed to have a wider horizontal sectional area than tile terminal inserting hole 13.

Figure 3:
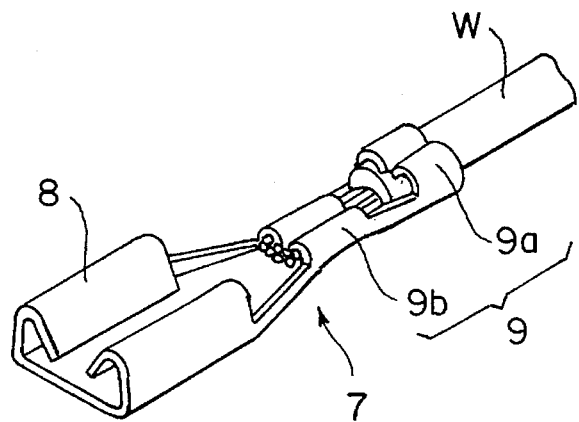
FIG. 3 is a perspective view of a single-pole female terminal.
Figure 4:
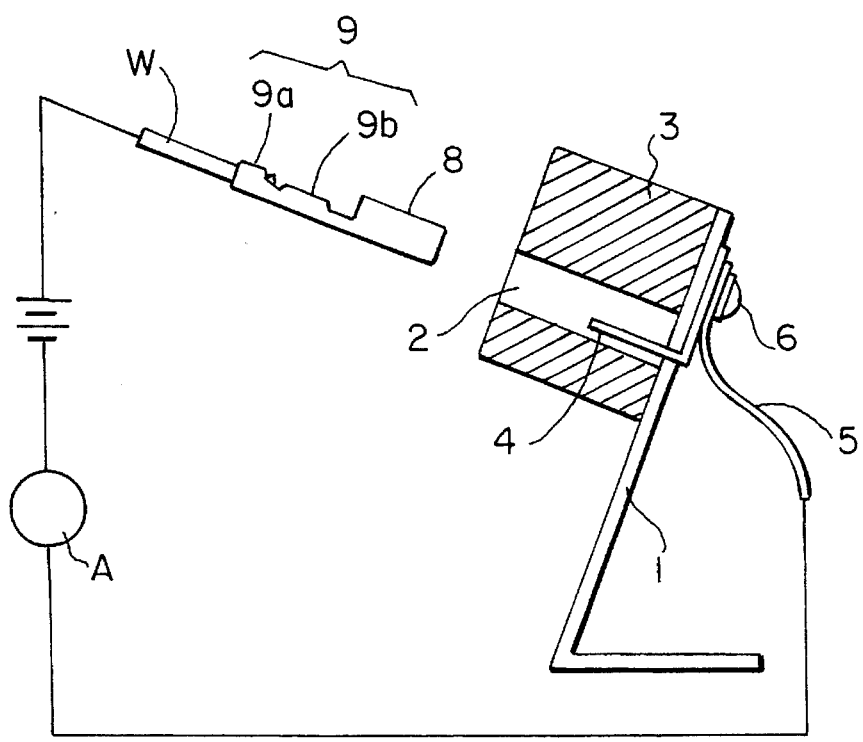
FIG. 4 is an explanatory view showing a conventional terminal inspecting device.

The terminal inserting hole 13 is formed into a shape and size so that the electric connection part 8 of the female terminal 7 shown in FIG. 3 can be inserted.

In the contact block accommodating hole 14, a contact block 15 which is made of a conductive material such as brass is inserted so as to be slidable vertically in the drawing and elastically attached to the frame 10 by an elastic member 16.

The elastic member 16 is a coil spring which is made of a conductive material such as iron, and the ends of the member 16 are press fitted to the contact block 15 and the frame 10, respectively.

The drive member 12 includes a cylinder connected to a valve which opens or closes according to an electric signal or a solenoid which operates according to an electric signal, and has a plunger 17 which moves back and forth with respect to the body block 11.

An leading end of plunger 17 is threaded to have a male screw part 17a and inserted into a hole formed in the lower end of a cover 18, and the cover 18 is fixed to the plunger 17 by means of two nuts 19,19 which are screwed to the male screw part 17a.

The upper end of the cover 18 is divided along a slit (not shown), one upper end extends upward to form a manual operating knob 18a, and the other upper end is bent at right angles to form a cover section 18b.

The manual operating knob 18a is used to operate the cover without using the drive member 12.

A cover guide 20 is attached atop the body block 11, and a guide groove 21 formed in the lower face of the cover guide 20 guides the cover section 18b which is movable along the surface of the body block 11.

A tapped hole (not shown) is formed in the leg 10b of the frame 10, and a circular terminal 24 which is fixed to one end of an electric wire 23 is fastened at the frame 10 by a screw 22.

The other end of the electric wire 23 is connected to the connecting electric wire W of the female terminal 7 through the measuring means A.

Prior to the insertion of the female terminal 7, the contact block 15 is pushed toward the terminal inserting hole 13 by the elastic member 16 and pressed against the top face of the contact block accommodating hole 14 as shown in FIG. 2.

The cover section 18b is positioned on the right side of the terminal inserting port in the drawing, and the terminal inserting hole 13 is open.

As shown in FIG. 1, when the electric connection part 8 of the female terminal 7 is inserted into the terminal inserting hole 13 to be pushed against the contact block 15, the contact block 15 is lowered against a pushing force of the elastic member 16, and the entire electric connection part 8 is completely inserted into the terminal inserting hole 13.

According to a signal from a sensor (not shown) disposed on the body block 11, the drive member 12 is driven to project the plunger 17, or an operator who has checked for complete insertion of the terminal 7 manually operates the knob 18a to move the cover section 18b, such that the terminal inserting hole 13 is closed by the cover section 18b. The cover section 18b prevents the removal of the female terminal 7 and keeps the female terminal 7 in contact with the block 15.

Thus, an electric circuit is formed by the measuring means A, the connected electric wire W, the female terminal 7, the contact block 15, the elastic member 16, the frame 10, and the electric wire 23, and the conduction of the connected electric wire W and the female terminal 7 is inspected by the measuring means A.

After the inspection, the plunger 17 and the cover section 18b are moved rightwardly in the drawing to open the terminal Inserting hole 13 by the drive member 12 or by manual operation. The female terminal 7 released from the cover section 18b is pushed by the contact block 15 and can be removed from the terminal inserting hole 13 easily.

When the inspected female terminal 7 is removed, one cycle of the inspection is completed. In the same way, female terminals can be inspected one by one.

According to the present invention, the contact block which comes into contact with a terminal to be inspected is elastically, fitted to the frame, and the movable cover is provided at the terminal inserting hole, so that the terminal can be securely inserted and kept in tile inspecting device by simple steps of inserting the terminal in the terminal inserting hole and moving the cover to close the terminal inserting hole. After inspection, the terminal can be easily removed because the terminal is released from the restriction by the cover and is moved upward by being pushed by the contact block. As a result, the connection state of the terminal and the connected electric wire can be easily and certainly inspected and inspection efficiency is improved as well.

Additionally, the electric connection section of the terminal is not deformed when the terminal is removed from the inspection device and the terminal quality is retained.

What is claimed is:

1. A terminal inspection device for inspecting a connection between a terminal add an electrical lead connected to the terminal, said inspection device comprising:

a frame made of a conductive material;

a body block supported by said frame and having a terminal inserting hole open to a surface of said body block and a contact block accommodating hole in contact with the terminal inserting hole and opening to said frame;

a conductive elastic member supported by said frame;

a conductive contact block supported by said conductive elastic member so as to be movably disposed within the contact block accommodating hole;

a terminal holding means for maintaining contact between the terminal and said conductive contact block when the terminal is inserted in the terminal inserting hole;

a drive means for operating the terminal holding means;

a measuring device for measuring electrical conductance; and an electric wire connected between said frame and said measuring device, said measuring device being electrically connected with the electrical lead of the terminal to inspect the terminal when the terminal is inserted in the terminal inserting hole, whereby an electrical circuit is formed by the electrical lead of the terminal, the terminal, said contact block, said elastic member, said frame, said electric wire and said measuring device, and wherein the connection between the terminal and the electrical lead of the terminal is inspected based on an output of said measuring device.

2. A terminal inspection device according to claim 1, wherein a cross sectional area of the contact block accommodating hole is larger than a cross sectional area of the terminal inserting hole.

3. A terminal inspection device according to claim 1, wherein said terminal holding means comprises a cover, said cover being movably disposed for opening and closing the terminal inserting hole.

4. A terminal inspection device according to claim 3, wherein said cover comprises a manual operating knob (18a).

5. A terminal inspection device according to claim 1, wherein said drive means comprises a drive member (12).

6. A terminal inspection device for inspecting a connection between a terminal and an electrical lead connected to the terminal, said inspection device comprising:

a frame made of a conductive material;

a body block supported by said frame and having a terminal inserting hole open to surface of said body block and a contact block accommodating hole in contact with the terminal inserting hole and opening to said frame;

a conductive elastic member supported by said frame;

a conductive contact block supported by said conductive elastic member so as to be movably disposed within the contact block accommodating hole;

a terminal holding means for maintaining contact between the terminal and said conductive contact block when the terminal is inserted in the terminal inserting hole;

a measuring device for measuring electrical conductance; and an electric wire connected between said frame and said measuring device, said measuring device being electrically connected with the electrical lead of the terminal to inspect the terminal when the terminal is inserted in the terminal inserting hole, whereby an electrical circuit is formed by the electrical lead of the terminal, the terminal, said contact block, said elastic member, said frame, said electric wire and said measuring device, and wherein, the connection between the terminal and the electrical lead of the terminal is inspected based on an output of said measuring device.

7. A terminal inspection device according to claim 6, wherein a cross sectional area of the contact block accommodating hole is larger than a cross sectional area of the terminal inserting hole.

8. A terminal inspection device according to claim 6, wherein said terminal holding means comprises a cover, said cover being movably disposed for opening and closing the terminal inserting hole.

9. A terminal inspection device according to claim 8, wherein said cover comprises a manual operating knob (18a).

10. A terminal inspection method for inspecting a connecting state of a terminal and a connected electric wire, said method comprising:

fixing a body block, the body block having a terminal inserting hole open to a surface of the body block and a contact block accommodating hole in contact with the terminal inserting hole, to a frame made of a conductive material;

elastically fitting a conductive contact block to the frame by a conductive elastic member, said conductive contact block being movably disposed within the contact block accommodating hole;

providing a means for holding a terminal in the terminal inserting hole, connecting an electric wire between a measuring means and the frame, inserting the terminal into the terminal inserting hole to contact the contact block against a biasing force of the elastic member, retaining the contact of the terminal with the contact block by inserting the terminal holding means in the terminal inserting hole, and connecting the connected electric wire of the terminal with the measuring means and observing an output of the measuring means to check the connecting state of the terminal and the connected electric wire.

11. A terminal inspection method according to claim 10, wherein a cross sectional area of the contact block accommodating hole is larger than a cross sectional area of the terminal inserting hole.

12. A terminal inspection method according to claim 10, wherein the terminal holding means comprises a cover, and wherein the cover is moved to open and close the terminal inserting hole.

13. A terminal inspection method according to claim 12, further comprising operating the cover with a drive means.

14. A terminal inspection method according to claim 12, further comprising operating the cover manually with a manual operation knob.

* * * * *